United States Patent [19]

Chung et al.

[11] Patent Number: 4,859,880

[45] Date of Patent: Aug. 22, 1989

[54] HIGH SPEED CMOS DIFFERENTIAL DRIVER

[75] Inventors: Paul W. Chung, San Jose; Niantsu N. Wang, Milpitas, both of Calif.

[73] Assignee: International Business Machines Corporation, Armonk, N.Y.

[21] Appl. No.: 207,481

[22] Filed: Jun. 16, 1988

[51] Int. Cl.⁴ .............................. H03K 17/693
[52] U.S. Cl. .................... 307/494; 307/443; 307/451; 307/452; 307/497; 307/262; 330/253; 330/277
[58] Field of Search ............... 307/443, 448, 451–452, 307/481, 494, 496–497, 500–501, 262, 269; 330/253, 277

[56] References Cited

U.S. PATENT DOCUMENTS

| | | | |
|---|---|---|---|
| 3,497,824 | 2/1970 | Goordman | 330/30 |
| 3,581,226 | 5/1971 | Perkins et al. | 330/30 |
| 3,870,966 | 3/1975 | Dingwall | 330/30 D |
| 3,970,950 | 7/1976 | Freeman, Jr. et al. | 330/30 D |
| 4,004,245 | 1/1977 | Ochi et al. | 330/30 D |
| 4,059,809 | 11/1977 | Sichart | 330/253 |
| 4,129,793 | 12/1978 | Bula et al. | 307/270 |
| 4,130,768 | 12/1978 | Bula et al. | 307/270 |
| 4,229,705 | 10/1980 | Takahashi et al. | 330/258 |
| 4,371,843 | 2/1983 | Fang et al. | 330/253 |
| 4,379,267 | 5/1983 | Young | 330/253 |
| 4,412,335 | 10/1983 | Froment et al. | 375/3 |
| 4,443,717 | 4/1984 | Hague | 307/362 |
| 4,496,857 | 1/1985 | Chao | 307/452 X |
| 4,521,704 | 6/1985 | Shinohara et al. | 307/530 |
| 4,542,306 | 9/1985 | Ikeda | 307/481 X |
| 4,542,308 | 9/1985 | Wincn et al. | 307/494 |
| 4,581,545 | 4/1986 | Beale et al. | 307/496 X |
| 4,617,477 | 10/1986 | DePaolis, Jr. | 307/451 X |
| 4,634,901 | 1/1987 | McElroy | 307/451 X |
| 4,638,259 | 1/1987 | Saari | 330/253 |
| 4,680,482 | 7/1987 | Obara | 307/262 X |
| 4,697,108 | 9/1987 | Chappell et al. | 307/496 X |
| 4,697,112 | 9/1987 | Ohtani et al. | 307/496 X |
| 4,733,112 | 3/1988 | Yamaguchi | 307/451 X |

FOREIGN PATENT DOCUMENTS 0015554 9/1980 European Pat. Off. ............ 307/496

OTHER PUBLICATIONS

Untitled Drawing Illustrates a Prior Art Bipolar Output Driver Circuit for Generating Complementary Output Signals.

Buttler et al., "Low Power-Low Noise Monolithic Detector Readout Electronics", Nuclear Instruments and Methods in Physics Research, A253 (1987, 439–443).

*Primary Examiner*—David Hudspeth
*Attorney, Agent, or Firm*—David J. Arthur

[57] ABSTRACT

A CMOS differential driver includes a differential amplifier with two input terminals. Complementary transfer gates selectively connect high and low voltage input terminals to the amplifier input terminals. The complementary transfer gates are controlled by identical logic input signals to provide exactly complementary voltage inputs to the differential amplifier circuit, so true complementary output signals are provided at the amplifier output terminals.

8 Claims, 1 Drawing Sheet

HIGH SPEED CMOS DIFFERENTIAL DRIVER

BACKGROUND OF THE INVENTION

The present invention relates to differential drivers for producing accurate complementary output signals from skewed complementary logic input signals.

One of the difficulties in differential driver design is to generate symmetric outputs in which the two output waveforms cross each other at exactly 50% of the waveform rise or fall time, so as to be exactly complementary.

Much of the signal processing in a device may today be done in one or more CMOS chips. But, to accurately generate output waveforms that are exactly complementary, and that are suitable to drive an output load, it has been necessary to construct the output differential driver circuit of bipolar devices. Thus, the output differential driver for a CMOS processor must be a separate device from the CMOS processor.

CMOS single-ended input differential drivers have been produced that take a single logic input signal and generate substantially complementary output signals. But, the output signals produced tend to be skewed; namely, they are not exactly complementary.

SUMMARY OF THE INVENTION

The present invention is a high speed differential driver that can be implemented on a CMOS chip and produces true differential outputs from substantially complementary, but possibly skewed, logic input signals.

The CMOS differential driver of the invention includes a differential amplifier that has first and second input terminals, and first and second transfer gates connected between the high and lower voltage input terminals and the first and second amplifier input terminals, respectively. The transfer gates are complementary in construction and are controlled by identical logic input signals to produce exactly complementary voltage signals at the amplifier input terminals.

As described in the Preferred Embodiment, each transfer gate is controlled by a pair of substantially complementary logic signals. The first transfer gate includes a pair of MOSFET devices, each connecting one of the voltage input terminals to the first amplifier input terminal. Each such MOSFET device is controlled by a respective one of the complementary logic input signals. The second transfer gate also includes a pair of MOSFET devices, each connecting one of the voltage input terminals to the second amplifier input terminal. Each of the second transfer gate MOSFET devices is also controlled by a respective one of the complementary logic input signals.

DETAILED DESCRIPTION OF THE PREFERRED EMBODIMENT

Figure 1:
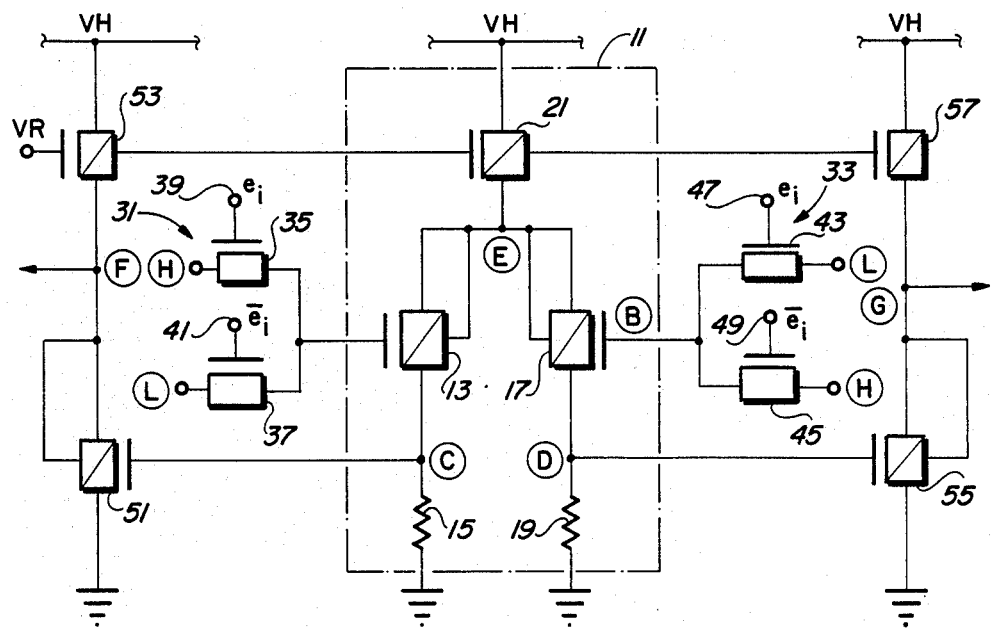
FIG. 1 illustrates a preferred embodiment of the differential driver of the invention.

Referring to FIG. 1, a diagram of a preferred embodiment of the CMOS differential driver of the present invention is illustrated.

In the illustrated embodiment, a differential amplifier 11 has a first input terminal A and a second input terminal B. The preferred differential amplifier includes a PMOS FET device 13 having its gate connected to the first amplifier input terminal A and a control resistor 15 connected in series between the PMOS FET and a reference voltage such as ground. An identical PMOS FET 17 and control resistor 19 are connected to the second amplifier input terminal B. A current source PMOS FET 21 is supplied from a high voltage source terminal VH. The current source FET 21 is connected to both of the PMOS FETs 13, 17 of the amplifier, and is controlled by a reference voltage VR.

The amplifier also includes a first and second output terminals C, D. The differential amplifier of this construction exhibits good common mode rejection, as is known in the art. Thus, the signals at the amplifier output terminals C, D will follow the signals at the amplifier input terminals A, B, but inverted in phase and amplified in amplitude.

The speed of the response of the output signals at the amplifier output nodes C, D is controlled by the size of the control resistors 15, 19. Resistors of a lower impedance will cause a faster output response, but a greater current will be required from the current source FET 21 to drive the output signal to a desired voltage level.

First and second pass or transfer gates 31, 33 are connected to the first and second differential amplifier input terminals A, B, respectively. The transfer gates control the connection of the high and low voltage source terminals H, L to the amplifier input terminals A, B. The transfer gates 31, 33 are complementary, and are controlled by identical logic input signals e, ē to provide exactly complementary control to the differential amplifier circuit.

Figure 2:
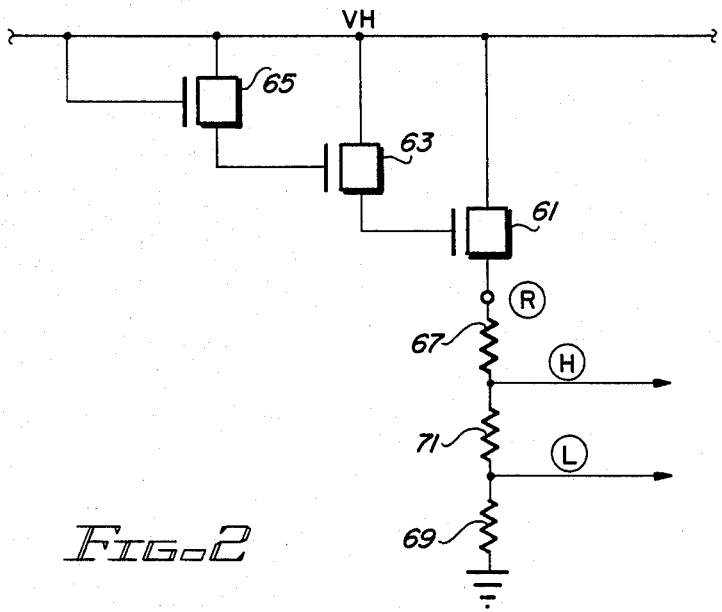
FIG. 2 illustrates a preferred embodiment of the input bias circuit for generating the high and low voltages that may be supplied to the high and low voltage input terminals of the driver circuit illustrated in FIG. 1.

Preferably, the high voltage terminals H are connected to the same output terminal of a high voltage source, such as the terminal H of the bias circuit shown in FIG. 2. But, two separate voltage terminals or sources supplying the same voltage could be used. Therefore, references to a single high voltage source terminal should be interpreted to also include separate terminals supplying the same voltage. Similarly, references to a low voltage source terminal include either a single source terminal such as the terminal L in the bias circuit of FIG. 2, or seperate voltage terminals or sources supplying the same voltage.

The first transfer gate 31 includes a pair of NMOS FET devices 35, 37. The first FET 35 selectively connects the high voltage input terminal H to the first amplifier input terminal A, while the second FET 37 selectively connects the low voltage input terminal L to the first amplifier input terminal A. These two FET devices 35, 37 are controlled by the substantially complementary logic input signals e, ē. The first logic signal e is received at the gate 39 of the first FET device 35, while the second (substantially complementary) logic signal ē is received at the gate 41 of the second FET device 37. Generation of suitable substantially complementary logic signals in CMOS circuitry is known in the art. As will be clear from the following description, the circuit incorporating the present invention will produce exactly complementary driver outputs despite the skew between the input logic signals e, ē.

The second transfer gate 33 is complementary to the first transfer gate 31, but is controlled by identical timing or logic pulses or signals to provide an input to the second amplifier input B that is exactly complementary to the input supplied by the first transfer gate to the first amplifier input terminal A. The second transfer gate includes a pair of NMOS FETs 43, 45 identical to the NMOS FETs 35, 37 of the first transfer gate. A third transistor NMOS FET device 43 connects the low voltage source terminal L to the second amplifier input B. This third transistor is controlled at its gate 47 by the first logic input signal e. A fourth transistor 45 connects the high voltage input source terminal H to the second amplifier input terminal B. This fourth transistor is controlled at its gate 49 by the second logic input signal ē, which is the complement of the first logic signal.

The first and third FET devices 35, 43 are preferably identical so that they have identical responses to the first logic signal e received at their gates 39, 47. That ensures that the first FET 35 connects the high voltage terminal H to the first amplifier input terminal A at the same instant that the third FET 43 connects the low voltage terminal L to the second amplifier input terminal B. Similarly, the second and fourth FET devices 37, 45 should be identical so that they also provide identical responses to the second logic signal ē. That ensures that the second FET 37 connects the low voltage terminal L to the first amplifier input terminal A at the same instant that the fourth FET 45 connects the high voltage terminal H to the second amplifier input terminal B. Ideally, all four FET devices 35, 37, 43, 45 are identical so that all connections between the voltage source terminals H, L and the amplifier input terminals A, B occur simultaneously.

Because the logic input signals e, ē of the transfer gates drive the transistors of the transfer gates in a symmetric way, and because of the good common mode rejection of the differential amplifier 11, skews between the logic input signal e and its complement ē have very little effect on the cross point of the output signals at the amplifier output terminals. Thus, the complementary pass gates controlled by identical logic input signals cause the voltage level supplied to the two input terminals A, B of the differential amplifier to be exactly complementary, even when the input logic signals are not. Consequently, the amplifier output signals at the amplifier output terminals C, D are also exactly complementary.

To maintain the pulse width of the logic input signal, the rise and fall times of the signals at the differential amplifier input terminals A, B should be approximately equal. In certain applications it may be necessary to adjust the relative sizes of the first and third transistors 35, 43 with respect to the second and fourth transistors 37, 45. But, to maintain the symmetric voltage connections through the two transfer gates 31, 33, the first and third transistors should be identical, and the second and fourth transistors also be identical.

Source follower circuits comprising PMOS FET devices 51, 53, 55, 57 are connected to the differential amplifier output terminals C, D to drive the driver output terminals F, G for driving external loads. The source followers have been found to faithfully reproduce the signals produced at the amplifier output nodes. Conventional amplifiers tend to reintroduce skew into the output signals. The capacitances of the FET devices 51, 55 affect the speed of the output response, with the lower capacitances providing faster response. However, the lower impedance in the FET devices 51, 55 necessitates that the current source FETs 53 and 57 produce larger currents to maintain a desired voltage at the driver output terminals G, H.

Referring now to FIG. 2, an embodiment of an input bias circuit for generating the high and low voltages supplied to the high and low voltage input terminals H, L of the transfer gates 31, 33 is described. The objective of this bias circuit is to reduce the transient disturbances at the voltage source terminals H, L when the first and second logic input signals e, ē switch. Three NMOS FET devices 61, 63, 65 provide the appropriate voltage level at the node R of the bias circuit.

The first FET device 61 together with a resistance 67 provides a low impedance path to the high voltage supply voltage line VH for the high voltage output node H. The second NMOS FET 63 of the bias circuit is connected between the gate of the first FET 61 and the high voltage supply line VH. The third NMOS FET 65 is connected between the gate of the second FET 63 and the high voltage supply line VH, and has its gate also connected to the high voltage supply line. The low voltage output terminal L has a low impedance path through the resistance 69 to ground.

For stability, the impedance of resistance 69 is preferably approximately equal to the sum of the resistance of the resistor 67 and the internal resistance of the first FET device 61. As is apparent, the impedance 71 controls the differential between the voltages at the bias circuit output terminals H, L.

The high voltage output terminal H of the bias circuit is connected to the high voltage source terminals H of the driver circuit shown in FIG. 1. The bias circuit's low voltage output terminal L is connected to the driver circuit low voltage input terminals L.

While a preferred embodiment of the invention has been described in detail, variations will be apparent to those skilled in the art without departing from the scope of the invention as defined in the following claims.

We claim:
1. A CMOS differential driver comprising:
   a differential amplifier having first and second input terminals;
   a first transfer gate connecting high and low voltage input terminals to said first amplifier input terminal; and
   a second transfer gate connecting said high and low voltage input terminals to said second amplifier input terminal, said transfer gates being complementary and controlled by identical logic input signals.

2. The CMOS differential driver of claim 1, wherein both of said transfer gates are controlled by a pair of substantially complementary logic signals.

3. The CMOS differential driver of claim 2, wherein:
   said first transfer gate comprises a pair of MOSFETs, each connecting one of said voltage input terminals to said first amplifier input terminal, each MOSFET being controlled by a respective one of said complementary logic input signals; and
   said second transfer gate comprises a pair of MOSFETs, each connecting one of said voltage input terminals to said second amplifier input terminal, each MOSFET being controlled by a respective one of said complementary logic input signals.

4. A method of generating complementary driver output signals in a CMOS chip comprising:
controlling a first transfer circuit connecting high and low voltage sources to a first input terminal of a differential amplifier with a pair of substantially complementary logic input signals; and
controlling a second transfer circuit connecting high and low voltage sources to a second input terminal of said differential amplifier with said pair of logic input signals.

5. The method of claim 4 wherein:
the first of said logic input signals controls a first pair of identical MOSFET devices in said first and second transfer circuits; and
the second of said logic input signals controls a second pair of identical MOSFET devices in said first and second transfer circuits.

6. The method of claim 4 wherein:
the first of said logic input signals causes said first transfer circuit to connect said high voltage source to said first amplifier input terminal and said second transfer circuit simultaneously to connect said low voltage source to said second amplifier input terminal; and
the second of said logic input signals causes said first transfer circuit to connect said low voltage source to said first amplifier input terminal and said second transfer circuit simultaneously to connect said high voltage source to said second amplifier input terminal.

7. A CMOS integrated circuit having a differential driver comprising:
a low gain, high speed differential amplifier having first and second input terminals and first and second output terminals;
first and second DC voltage terminals;
a first pass gate connecting said first and second DC voltage terminals to said first amplifier input terminal; and
a second pass gate connecting said first and second DC voltage terminals to said second amplifier input terminal;
wherein said first and second pass gates are complementary and are controlled by identical timing pulses.

8. The CMOS differential driver of claim 7, additionally comprising a first logic input terminal for receiving a first timing pulse and a second logic input terminal for receiving a second timing pulse, wherein said second timing pulse is substantially the complement of said first timing pulse, wherein:
said first pass gate comprises a pair of FET devices, wherein one of said FET devices has its conduction path connected between said first DC voltage input terminal and said first amplifier input terminal and its gate connected to said first logic input terminal, and the other FET device has its conduction path connected between said second DC voltage input terminal and said first amplifier input terminal and its gate connected to said second logic input terminal; and
said second pass gate comprises a pair of FET devices, wherein one of said FET devices has its conduction path connected between said second DC voltage terminal and said second amplifier input terminal and its gate connected to said first logic input terminal, and the other FET device has its conduction path connected between said first DC voltage terminal and said second amplifier input terminal and its gate connected to said second logic input terminal.

* * * * *